United States Patent
Chen et al.

(10) Patent No.: US 8,217,421 B2
(45) Date of Patent: Jul. 10, 2012

(54) ESD PROTECTION DEVICE WITH VERTICAL TRANSISTOR STRUCTURE

(75) Inventors: Zi-Ping Chen, Taipei County (TW); Kun-Hsien Lin, Hsinchu (TW); Ryan Hsin-Chin Jiang, Taipei (TW)

(73) Assignee: Amazing Microelectronic Corp., Hsin-Chu (TW)

( * ) Notice: Subject to any disclaimer, the term of this patent is extended or adjusted under 35 U.S.C. 154(b) by 92 days.

(21) Appl. No.: 12/840,749

(22) Filed: Jul. 21, 2010

(65) Prior Publication Data

US 2012/0018778 A1   Jan. 26, 2012

(51) Int. Cl.
*H01L 29/66* (2006.01)

(52) U.S. Cl. .................. 257/173; 257/175; 257/E27.05

(58) Field of Classification Search ............... 257/173
See application file for complete search history.

(56) References Cited

U.S. PATENT DOCUMENTS

| | | | |
|---|---|---|---|
| 2001/0007521 A1* | 7/2001 | Chen | 361/56 |
| 2004/0080883 A1* | 4/2004 | Chatterjee et al. | 361/56 |

* cited by examiner

*Primary Examiner* — Ajay K Arora
(74) *Attorney, Agent, or Firm* — WPAT., P.C.; Justin King

(57) ABSTRACT

A new ESD protection device with an integrated-circuit vertical transistor structure is disclosed, which includes a heavily doped p-type substrate ($P^+$ substrate), a n-type well (N well) in the $P^+$ substrate, a heavily doped p-type diffusion ($P^+$ diffusion) in the N well, a heavily doped n-type diffusion ($N^+$ diffusion) in the N well, and a p-type well (P well) surrounding the N well in the $P^+$ substrate. A bond pad is connected to both the $P^+$ and $N^+$ diffusions, and a ground is coupled to the $P^+$ substrate. Another $P^+$ diffusion is implanted in the N well or another $N^+$ diffusion is implanted in the P well to form a Zener diode, which behaves as a trigger for the PNP transistor when a positive ESD zaps. A parasitic diode is formed at the junction between the $P^+$ substrate and the N well, to bypass a negative ESD stress on the bond pad.

8 Claims, 3 Drawing Sheets

ESD PROTECTION DEVICE WITH VERTICAL TRANSISTOR STRUCTURE

TECHNICAL FIELD

The present disclosure relates to an electrostatic discharge (ESD) protection device, and more particularly, to an integrated-circuit ESD protection device having a vertical transistor structure and working well for both positive and negative ESD currents.

TECHNICAL BACKGROUND

The ESD issue is an essential consideration in design and operation of integrated circuit devices. Inputs and outputs of the integrated circuits may be subject to undesirable ESD. Usually the fast, transient and high-voltage ESD would cause destructive damage of the integrated circuits, such as the dielectric breakdown of oxides. To overcome such a problem, various ESD protection circuits have been used at input or output terminals of the integrated circuits to provide a safe path for the ESD current to bypass. Once an ESD zaps, the ESD current is discharged through the ESD protection circuit, thus preventing the integrated circuit to be protected from damage.

Conventional ESD protection circuits are based on the lateral structure of NPN or PNP transistors or require additional trigger elements to speed up turning-on of the transistors. To minimize integrated-circuit layout area for an ESD protection circuit, it is desirable to integrate a parasitic trigger element with a transistor switch having a vertical structure. Furthermore for reasons of both positive and negative ESD protection, it is preferable to develop an ESD protection device with protective ability for both positive and negative ESD currents.

TECHNICAL SUMMARY

According to one aspect of the present invention, an integrated-circuit ESD protection structure includes a heavily doped p-type substrate ($P^+$ substrate), a n-type well (N well) in the $P^+$ substrate, a heavily doped p-type diffusion ($P^+$ diffusion) in the N well, a heavily doped n-type diffusion ($N^+$ diffusion) in the N well, and a p-type well (P well) surrounding the N well in the $P^+$ substrate. A bond pad is connected to both the $P^+$ and $N^+$ diffusions, and a ground is coupled to the $P^+$ substrate. The N well is located substantially on the $P^+$ substrate, and the $P^+$ diffusion is located substantially on the N well, thus a vertical PNP transistor is formed. Another $P^+$ diffusion is implanted in the N well or another $N^+$ diffusion is implanted in the P well to form a Zener diode, which behaves as a trigger for the PNP transistor when a positive ESD zaps. The Zener diode is integrated with the vertical PNP transistor, without a need of an additional chip area to layout the Zener diode. Moreover, a parasitic diode is formed at the junction between the $P^+$ substrate and the N well, to bypass a negative ESD stress on the bond pad. Thus ESD protection for both positive and negative ESD currents can be achieved in the embodiment.

According to another aspect of the present invention, an integrated-circuit ESD protection structure includes a $P^+$ substrate, an N well in the $P^+$ substrate, a first $P^+$ diffusion in the N well, an $N^+$ diffusion in the N well, a P well surrounding the N well in the $P^+$ substrate, and a second $P^+$ diffusion in the P well and electrically connected to the $N^+$ diffusion. A bond pad is connected to the $P^+$ substrate, and a ground is coupled to the first $P^+$ diffusion. The N well is located substantially on the $P^+$ substrate, and the first $P^+$ diffusion is located substantially on the N well, thus a vertical PNP transistor is formed. A Zener diode is formed vertically at the junction between the first $P^+$ diffusion and the N well, and behaves as a trigger for the PNP transistor when a positive ESD zaps. The Zener diode is integrated with the vertical PNP transistor, without a need of an additional chip area to layout the Zener diode. Moreover, a diode is formed laterally at the junction between the first $P^+$ diffusion and the N well, to bypass a negative ESD stress on the bond pad. Thus ESD protection for both positive and negative ESD currents can also be achieved in the embodiment.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

To further understand and recognize the fulfilled functions and structural characteristics of the disclosure, several exemplary embodiments cooperating with detailed description are presented as follows.

Figure 1:
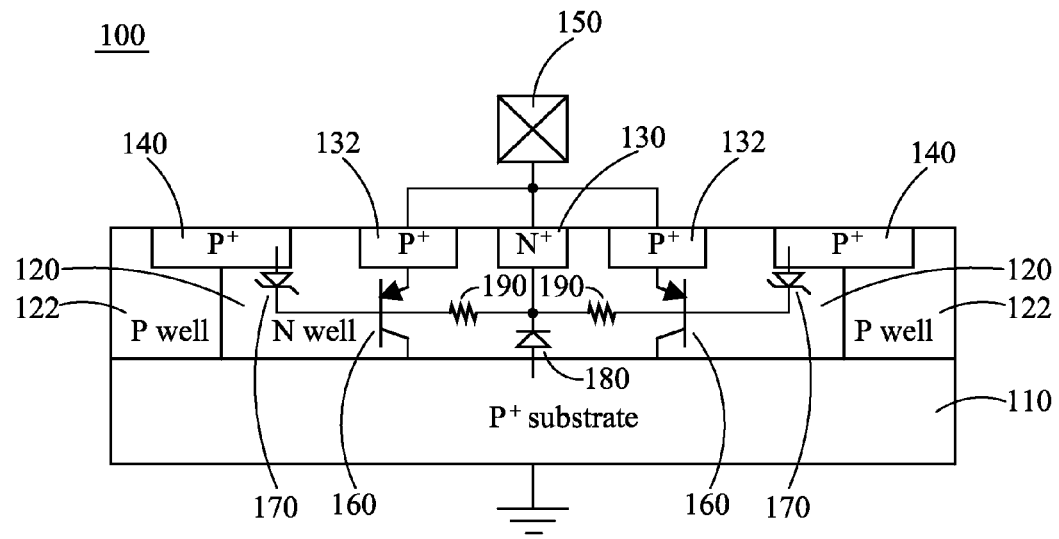
FIG. 1 is a cross-sectional diagram of an ESD protection device structure, according to a first embodiment of the present invention.

Referring to FIG. 1, a cross-sectional diagram of an ESD protection device structure is schematically illustrated, according to a first embodiment of the present invention. The ESD protection structure 100 comprises a $P^+$ substrate 110, an N well 120 in the $P^+$ substrate 110, a first $P^+$ diffusion 132 and a first $N^+$ diffusion 130 in the N well 120, a P well 122 surrounding the N well 120 in the $P^+$ substrate 110, and a second $P^+$ diffusion 140 in and between the N and P wells 120/122, wherein a bond pad 150 connected to both the first $P^+$ and $N^+$ diffusions 132/130. The $P^+$ substrate 110 is coupled to the second $P^+$ diffusion 140 through the P well 122. The $P^+$ substrate 110 may be a heavily doped p-type well in an integrated-circuit substrate and is generally coupled to ground.

Figure 2:
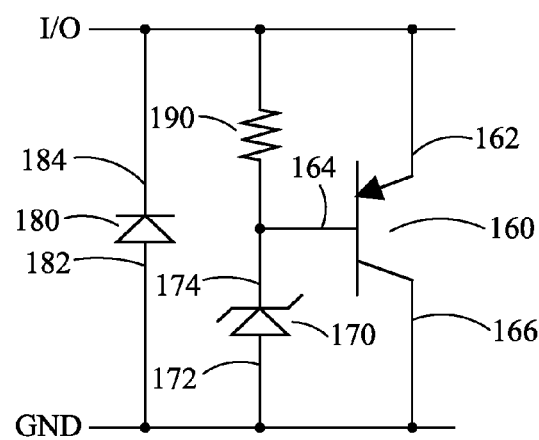
FIG. 2 is an equivalent circuit diagram corresponding to the ESD protection structure of the embodiments.

An equivalent circuit diagram corresponding to the ESD protection structure may be schematically shown in FIG. 2. The N well 120 is located substantially on the P⁺ substrate 110, and the first P⁺ diffusion 132 is located substantially on the N well 120, thus a vertical PNP transistor 160 is formed with the first P⁺ diffusion 132 being the emitter 162, the N well 120 being the base 164, and the P⁺ substrate 110 being the collector 166. A diode 180 is parasitically formed with the P⁺ substrate 110 being the anode 182 and the N well 120 being the cathode 184. A Zener diode 170, to trigger or activate speedily the PNP transistor 160, is formed with the second P⁺ diffusion 140 being the anode 172 and the N well 120 being the cathode 174. A resistance 190 may parasitically exist between the PNP base 164 and the diode cathode 184 in the N well 120. It is well known to those skilled in the art that the first N⁺ diffusion 130 is used as an ohmic contact coupling the N well 120 to another device or a voltage level. Consequently the bond pad 150 connects to the PNP emitter 162, the diode cathode 184 and the resistance 190; and a ground is coupled to the collector 166, the diode anode 182 and the Zener diode anode 172.

The operational principles of the ESD protection circuit are explained as follows with the aid of FIG. 2. In normal circuit operating conditions, the voltage level of the N well 120 is in accordance with the input or output power supplies through the bond pad 150, and the breakdown voltage of the Zener diode 170 is higher than the normal input or output operating voltage; therefore the PNP transistor 160 is kept off and would not influence the operation of the circuit being ESD protected. When a positive ESD zaps on the bond pad and then activates breakdown effects of the Zener diode 170, the voltage level of the N well decreases so that the ESD current flows through the first N⁺ diffusion into the N well and then through the Zener diode 170. As the ESD current passes through the parasitic resistance 190 to cause a voltage difference between the PNP emitter 162 and base 164, the PNP transistor 160 can be turned on to discharge the ESD energy much more speedily to the ground. In such a circumstance, the Zener diode may be regarded as the trigger of the PNP transistor in the ESD protection device according to the embodiment of the invention. On the other hand, when a negative ESD zaps on the bond pad, the diode 180 parasitizing at the junction between the P⁺ substrate 110 and the N well 120 can be turned on to discharge the ESD energy speedily. It is noted that the ESD protection mechanism works well for both positive and negative ESD currents.

Figure 3:
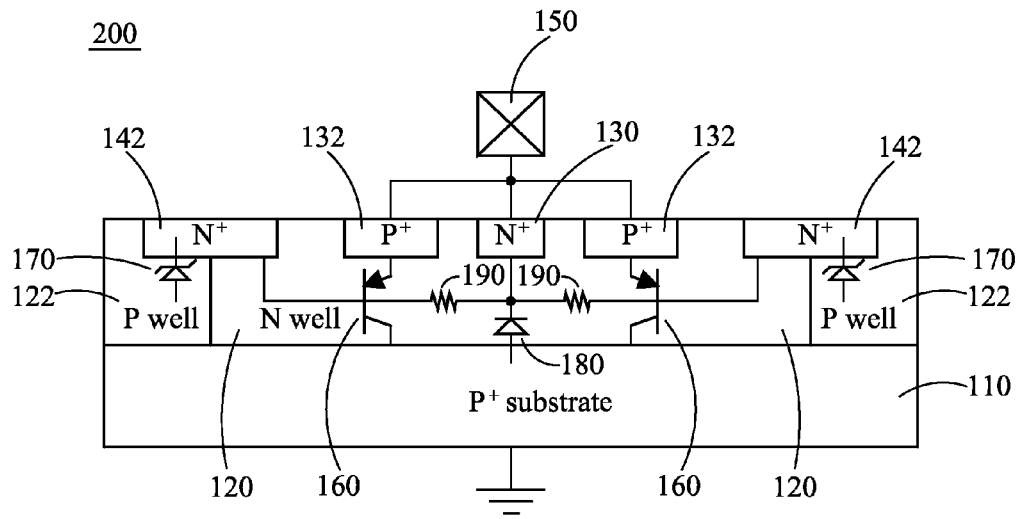
FIG. 3 is a cross-sectional diagram of an ESD protection device structure, according to a second embodiment of the present invention.

Another ESD protection device structure, according to a second embodiment of the present invention, is schematically shown in FIG. 3. The ESD protection structure 200 comprises a P⁺ substrate 110, an N well 120 in the P⁺ substrate 110, a first P⁺ diffusion 132 and a first N⁺ diffusion 130 in the N well 120, a P well 122 surrounding the N well 120 in the P⁺ substrate 110, and a second N⁺ diffusion 142 in and between the N and P wells 120/122, wherein a bond pad 150 connected to both the first P⁺ and N⁺ diffusions 132/130. The P⁺ substrate 110 may be a heavily doped p-type well in an integrated-circuit substrate and is generally coupled to ground. The equivalent circuit in FIG. 2 and the operational principles thereof are also applicable to the second embodiment, except that here the Zener diode 170 is formed with the P well 122 being the anode 172 and the second N⁺ diffusion 142 being the cathode 174.

Figure 4:
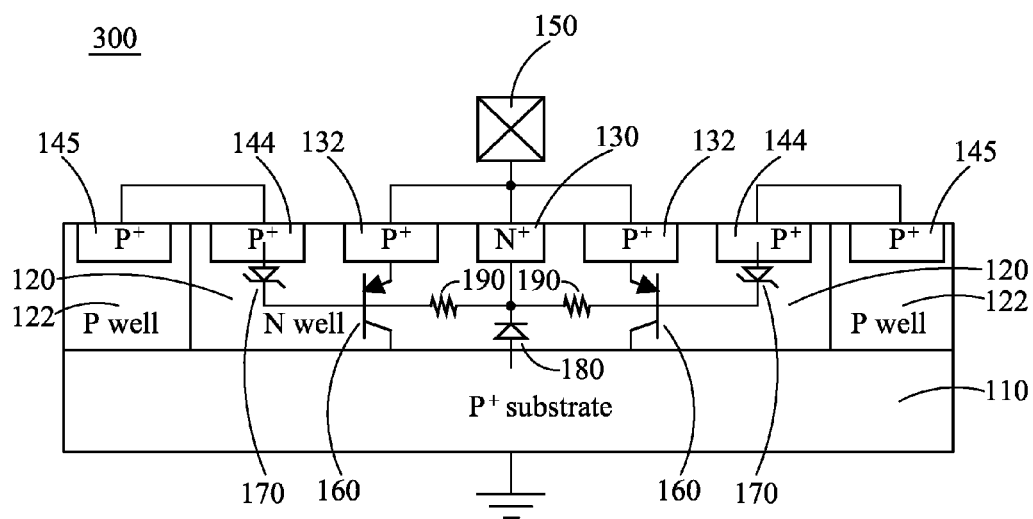
FIG. 4 is a cross-sectional diagram of an ESD protection device structure, according to a third embodiment of the present invention.

Another ESD protection device structure, according to a third embodiment of the present invention, is schematically shown in FIG. 4. The ESD protection structure 300 comprises a P⁺ substrate 110, an N well 120 in the P⁺ substrate 110, a first P⁺ diffusion 132 and a first N⁺ diffusion 130 in the N well 120, a P well 122 surrounding the N well 120 in the P⁺ substrate 110, a second P⁺ diffusion 144 in the N well 120, and a third P⁺ diffusion 145 in the P well 122, wherein the second P⁺ diffusion 144 is electrically connected to the third P⁺ diffusion 145, and a bond pad 150 connected to both the first P⁺ and N⁺ diffusions 132/130. The P⁺ substrate 110 is coupled to the third P⁺ diffusion 145 through the P well 122. The P⁺ substrate 110 may be a heavily doped p-type well in an integrated-circuit substrate and is generally coupled to ground. The equivalent circuit in FIG. 2 and the operational principles thereof are also applicable to the third embodiment, except that here the Zener diode 170 is formed with the second P⁺ diffusion 144 being the anode 172 and the N well 120 being the cathode 174.

Figure 5:
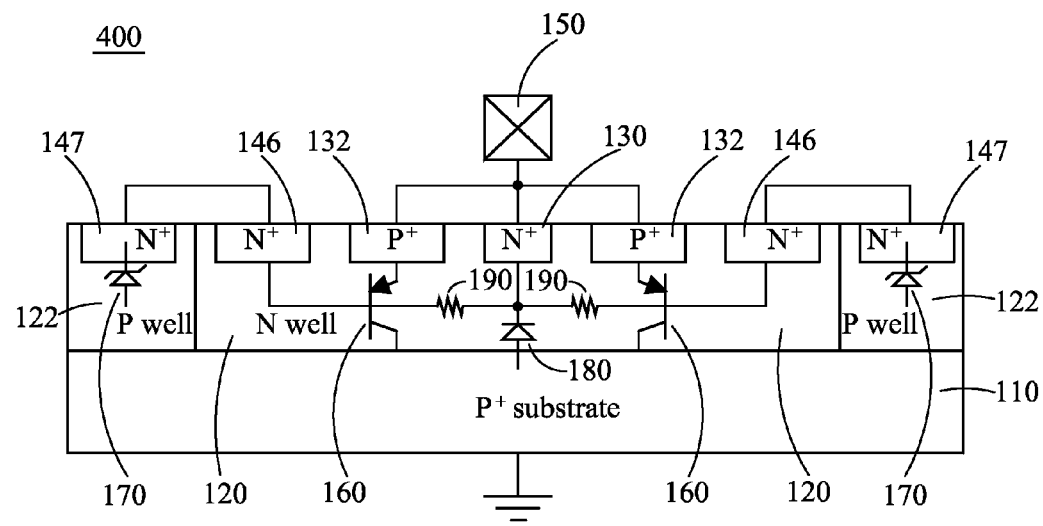
FIG. 5 is a cross-sectional diagram of an ESD protection device structure, according to a forth embodiment of the present invention.

Another ESD protection device structure, according to a forth embodiment of the present invention, is schematically shown in FIG. 5. The ESD protection structure 400 comprises a P⁺ substrate 110, an N well 120 in the P⁺ substrate 110, a first P⁺ diffusion 132 and a first N⁺ diffusion 130 in the N well 120, a P well 122 surrounding the N well 120 in the P⁺ substrate 110, a second N⁺ diffusion 146 in the N well 120, and a third N⁺ diffusion 147 in the P well 122, wherein the second N⁺ diffusion 146 is electrically connected to the third N⁺ diffusion 147, and a bond pad 150 connected to both the first P⁺ and N⁺ diffusions 132/130. The P⁺ substrate 110 may be a heavily doped p-type well in an integrated-circuit substrate and is generally coupled to ground. The equivalent circuit in FIG. 2 and the operational principles thereof are also applicable to the forth embodiment, except that here the Zener diode 170 is formed with the P well 122 being the anode 172 and the third N⁺ diffusion 147 being the cathode 174.

Figure 6:
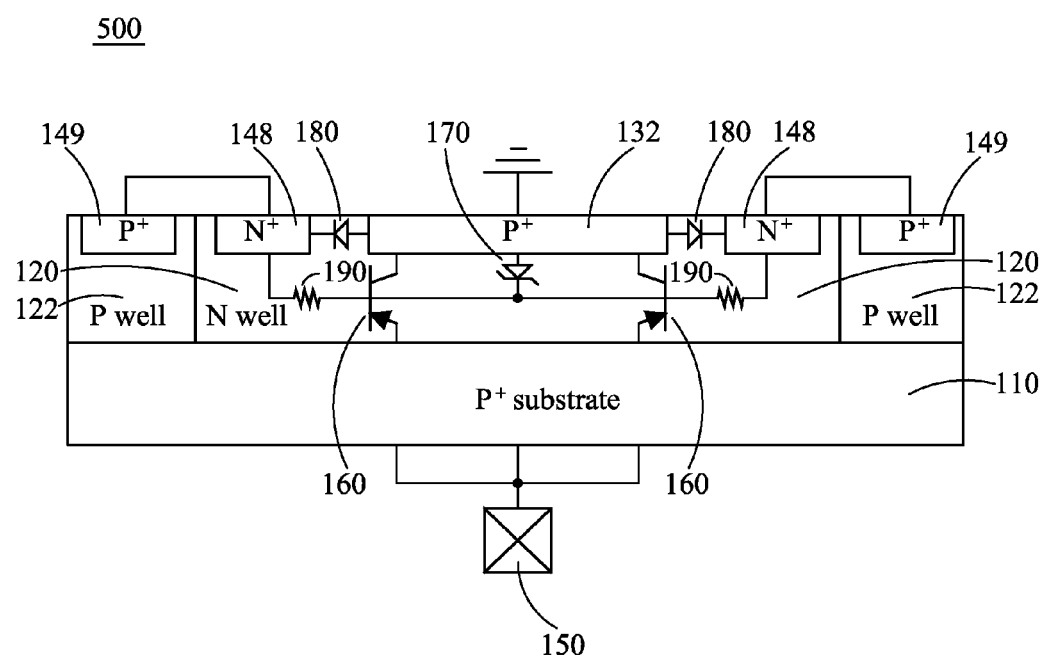
FIG. 6 is a cross-sectional diagram of an ESD protection device structure, according to a fifth embodiment of the present invention.

Another ESD protection device structure, according to a fifth embodiment of the present invention, is schematically shown in FIG. 6. The ESD protection structure 500 comprises a P⁺ substrate 110, an N well 120 in the P⁺ substrate 110, a first P⁺ diffusion 132 and an N⁺ diffusion 148 in the N well 120, a P well 122 surrounding the N well 120 in the P⁺ substrate 110, and a second P⁺ diffusion 149 in the P well 122, wherein the N⁺ diffusion 148 is electrically connected to the second P⁺ diffusion 149, a bond pad 150 is connected to the P⁺ substrate 110, so that the N⁺ diffusion 148 is coupled to the bond pad through the P well 122 and its ohmic-contact second P⁺ diffusion 149. The P⁺ substrate 110 may be a heavily doped p-type well in an integrated-circuit substrate. The equivalent circuit in FIG. 2 and the operational principles thereof are also applicable to the fifth embodiment. Here the N well 120 is located substantially on the P⁺ substrate 110, and the first P⁺ diffusion 132 is located substantially on the N well 120, thus a vertical PNP transistor 160 is formed with the P⁺ substrate 110 being the emitter 162, the N well 120 being the base 164, and the first P⁺ diffusion 132 being the collector 166. A Zener diode 170, to trigger or activate speedily the PNP transistor 160, is vertically formed with the first P⁺ diffusion 132 being the anode 172 and the N well 120 being the cathode 174. A diode 180 is laterally formed with the first P⁺ diffusion 132 being the anode 182 and the N well 120 being the cathode 184, and the N⁺ diffusion 148 is used as an ohmic contact coupling the N well 120 to another device or a voltage level. A resistance 190 may parasitically exist between the PNP base 164 and the diode cathode 184 in the N well 120. The bond pad 150 is connected to the P⁺ substrate 110 to electrically couple the PNP emitter 162, the diode cathode 184 and the resistance 190 through the P well 122, second P+ diffusion 149 and N+ diffusion 148. The ground is connected to the first P+ diffusion 132 to couple the PNP collector 166, the diode anode 182 and the Zener diode anode 172.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An integrated-circuit ESD protection structure, comprising:
    a heavily doped p-type substrate (P+substrate);
    a n-type well (N well) in the P+substrate;
    a first heavily doped p-type diffusion (P+diffusion) region the N well;
    a first heavily doped n-type diffusion (N+diffusion) region the N well; and
    a p-type well (P well) surrounding the N well in the P+substrate;
    wherein a bond pad is connected to both the first P+and N+diffusion regions, and the P+substrate is coupled to ground directly by the bottom of the P+substrate.

2. An integrated-circuit ESD protection structure of claim 1, further comprising a second P+diffusion region and between the N and P wells.

3. An integrated-circuit ESD protection structure of claim 1, further comprising a second N+diffusion region and between the N and P wells.

4. An integrated-circuit ESD protection structure of claim 1, further comprising:
    a second P+diffusion region the N well; and
    a third P+diffusion region the P well;
    wherein the second P+diffusion region is electrically connected to the third P+diffusion region.

5. An integrated-circuit ESD protection structure of claim 1, further comprising:
    a second N+diffusion region the N well; and
    a third N+diffusion region the P well;
    wherein the second N+diffusion region is electrically connected to the third N+diffusion region.

6. An integrated-circuit ESD protection structure, comprising
    a P+substrate;
    a N well in the P+substrate;
    a first P+diffusion region the N well;
    a N+diffusion region the N well;
    a P well surrounding the N well in the P+substrate; and
    a second P+diffusion region the P well;
    wherein a bond pad connected to the P+substrate, and the second P+diffusion region is electrically connected to the N+diffusion region.

7. An integrated-circuit ESD protection structure of claim 6, wherein the P+substrate is a heavily doped p-type well in an integrated-circuit substrate.

8. An integrated-circuit ESD protection structure of claim 6, wherein the first P+diffusion region is coupled to ground.

* * * * *